United States Patent
Geiger et al.

(10) Patent No.: US 9,941,084 B2
(45) Date of Patent: Apr. 10, 2018

(54) SWITCHING DEVICES FOR MEDICAL APPARATUSES AND RELATED SYSTEMS AND METHODS

(75) Inventors: Peter Geiger, Eningen (DE); Olaf Krause, Neuruppin (DE); Steffen Loeser, Unterwellenborn OT Goddwitz (DE); Falk Georgi, Saalfelder Hoehe (DE); Joachim Sasse, Falkensee (DE)

(73) Assignee: TRUMPF MEDIZIN SYSTEME GMBH + CO. KG, Saalfeld (DE)

( * ) Notice: Subject to any disclaimer, the term of this patent is extended or adjusted under 35 U.S.C. 154(b) by 883 days.

(21) Appl. No.: 13/297,345

(22) Filed: Nov. 16, 2011

(65) Prior Publication Data

US 2012/0118718 A1     May 17, 2012

(30) Foreign Application Priority Data

Nov. 16, 2010 (EP) .................................. 10191330

(51) Int. Cl.
*H01H 31/10* (2006.01)
*H01H 33/59* (2006.01)
(Continued)

(52) U.S. Cl.
CPC ........... *H01H 36/004* (2013.01); *A61G 7/018* (2013.01); *A61G 13/02* (2013.01);
(Continued)

(58) Field of Classification Search
CPC .... H04Q 3/00; H04Q 3/0004; H05B 37/0209; G05B 19/02; H01H 9/06; H01H 9/00; H01H 9/10
(Continued)

(56) References Cited

U.S. PATENT DOCUMENTS 4,767,943 A     8/1988 Adler et al.
5,990,772 A  *  11/1999 Van Zeeland ............ G01D 5/06
                                                  200/521
(Continued)

FOREIGN PATENT DOCUMENTS

DE         19946471 A1    3/2001
DE     202008009716 U1    1/2009
(Continued)

OTHER PUBLICATIONS

Parital translation of the Reasons for Opposition against European Patent No. 2 455 959 B1 dated Dec. 13, 2013 (15 pages), with attachments: Technical Drawings 1 (German) D8-D10 (3 pages); Delivery Receipt 1 (German) D11 (2 pages); Wiring schemes (German) D12, D13 (2 pages); Single Fault Condition Review (English) D14 (5 pages); Photos of Remote Control 1 D15-D17 (3 pages); Technical Drawings 2 (German) D18-D21 (4 pages); Wiring scheme (German) D22 (1 pages); Photos of Remote Control 2 D23, D24 (2 pages); and Delivery Receipt 2 (German) D25 (4 pages).
(Continued)

*Primary Examiner* — Fritz M Fleming
*Assistant Examiner* — Jagdeep Dhillon
(74) *Attorney, Agent, or Firm* — Barnes & Thornburg LLP

(57) ABSTRACT

In some aspects, a switching device for a medical apparatus includes a first switching member adapted to select an assigned operating function of the medical apparatus; and a second switching member adapted to permit the selecting of the assigned operating function of the first switching member. The second switching member is adapted such that it has a detection space in which it detects a presence of an operating object; and the first switching member is arranged in the detection space of the second switching member.

24 Claims, 5 Drawing Sheets

(51) Int. Cl.
*H01H 47/00* (2006.01)
*H01H 85/46* (2006.01)
*H01H 19/14* (2006.01)
*H01H 36/00* (2006.01)
*A61G 7/018* (2006.01)
*A61G 13/02* (2006.01)
*H03K 17/955* (2006.01)

(52) U.S. Cl.
CPC ...... *A61G 2203/12* (2013.01); *A61G 2203/42* (2013.01); *A61G 2203/70* (2013.01); *H03K 17/955* (2013.01)

(58) Field of Classification Search
USPC ........ 307/115, 64, 126, 17, 127; 5/616, 618; 700/275; 341/176, 177, 178; 335/207, 335/205, 521, 512; 200/520, 404, 519
See application file for complete search history.

(56) References Cited

U.S. PATENT DOCUMENTS

| | | | | |
|---|---|---|---|---|
| 6,303,887 | B1 * | 10/2001 | Ando | H01H 13/702 200/1 B |
| D631,853 | S * | 2/2011 | Choi et al. | D13/168 |
| 7,929,859 | B2 * | 4/2011 | Saiki | G03B 17/00 267/168 |
| 2004/0182685 | A1 * | 9/2004 | Tsunemoto | G11B 15/106 200/5 R |
| 2006/0150333 | A1 * | 7/2006 | Harding | A61G 7/018 5/618 |
| 2009/0126115 | A1 * | 5/2009 | Doering | A61G 7/018 5/616 |
| 2010/0038227 | A1 | 2/2010 | Lu | |
| 2011/0015631 | A1 * | 1/2011 | Wiener | A61B 17/320092 606/42 |
| 2011/0061466 | A1 * | 3/2011 | Nishino | A61B 8/00 73/632 |

FOREIGN PATENT DOCUMENTS

| | | | |
|---|---|---|---|
| DE | 102007055465 | A1 | 5/2009 |
| DE | 102009017842 | A1 | 10/2010 |
| EP | 0234193 | B1 | 4/1995 |
| EP | 0917868 | A1 | 5/1999 |
| EP | 1758137 | A2 | 2/2007 |
| EP | 2113268 | A1 | 11/2009 |
| GB | 2465472 | A | 5/2010 |
| JP | 2007103285 | A * | 4/2007 |
| WO | 2004098083 | A1 | 11/2004 |

OTHER PUBLICATIONS

DE19946471A1 Partial Translation, 2 pgs.
DE102009017842A1 Partial Translation, 1 pg.
DE202008009716U1 Partial Translation, 1 pg.
German Language Submission of Party Opposing EP2455959B1, the European counterpart to the present application, May 23, 2016, 6 pages.
Delivery receipt of Keyboard PCB 0970 3923 02 (D30) (German).
Change application Nr. 94402A (D31) (German).
Change application Nr. 13A061 (D32) (German).
Delivery receipt 80665897 of Feb. 14, 2008 (D33).
Single fault condition review: IR Transmitter 3110.49E9 (D34) (English).
Partial translation of a submission of the opponent against the European Patent 2 455 959 B1.

\* cited by examiner

SWITCHING DEVICES FOR MEDICAL APPARATUSES AND RELATED SYSTEMS AND METHODS

CROSS REFERENCE TO RELATED APPLICATIONS

This application claims priority under 35 U.S.C. § 119 to European Patent Application No. 10 191 330.9, filed on Nov. 16, 2010. The contents of the prior application are hereby incorporated by reference in their entirety.

TECHNICAL FIELD

The invention relates to switching devices for medical apparatuses and to related systems and methods.

BACKGROUND

Medical apparatuses (e.g., moveable medical apparatuses operated by electromechanical devices) typically have safety fault switches to prevent harm or danger to patients, operators, and others present during operations of medical apparatuses. Switching devices are used to prevent medical apparatuses from being operated unintentionally (e.g., by unintentional switching of the operating functions of the medical apparatuses) while also detecting possible faults in the switching device.

Unintentional switching of the operating functions is mostly prevented by using two electro-mechanical switches that are separated spatially from one another. However, due to the spatial separation, operating two switches can be difficult or complicated when the operating force is high and both switches are operated by one hand.

Furthermore, there is the risk that when using two switches of the similar type with similar switching principles, in the event of an error (e.g., due to mechanical damage or spillage of liquids on the switches), both of the switches may be damaged and therefore faultily switch, especially if they are located in close proximity to one another.

A fault of one of the switches (e.g., the contacts of a switch sticking together) is typically not detected immediately when the switch is released.

SUMMARY

In some aspects, a switching device for a medical apparatus includes at least one first switching member for selecting an operating function of the medical apparatus and at least one second switching member enabling the switching function of the at least one first switching member. Switching of the first and second switching members is based on different switching principles and the second switching member includes a detection space in which a presence of an operating object is detected and at least one of the first switching members is arranged in the detection space of at least one of the second switching members.

Using the systems and methods described herein, a switching device for a medical apparatus can be ergonomically operated and still provide adequate fault safety.

DESCRIPTION OF DRAWINGS

FIG. 3b is an enlarged front view of a circuit board of the switching device of FIG. 3a.

FIG. 4a is a cross-sectional view through the cutting line A-A shown in FIG. 3a illustrating a first switching member of a key of the switching device of FIG. 3a.

FIG. 4b is a cross-sectional view through the cutting line A-A shown in FIG. 3a illustrating a detection region of a second switching member of the key of the switching device of FIG. 3a.

DETAILED DESCRIPTION

Figure 1:
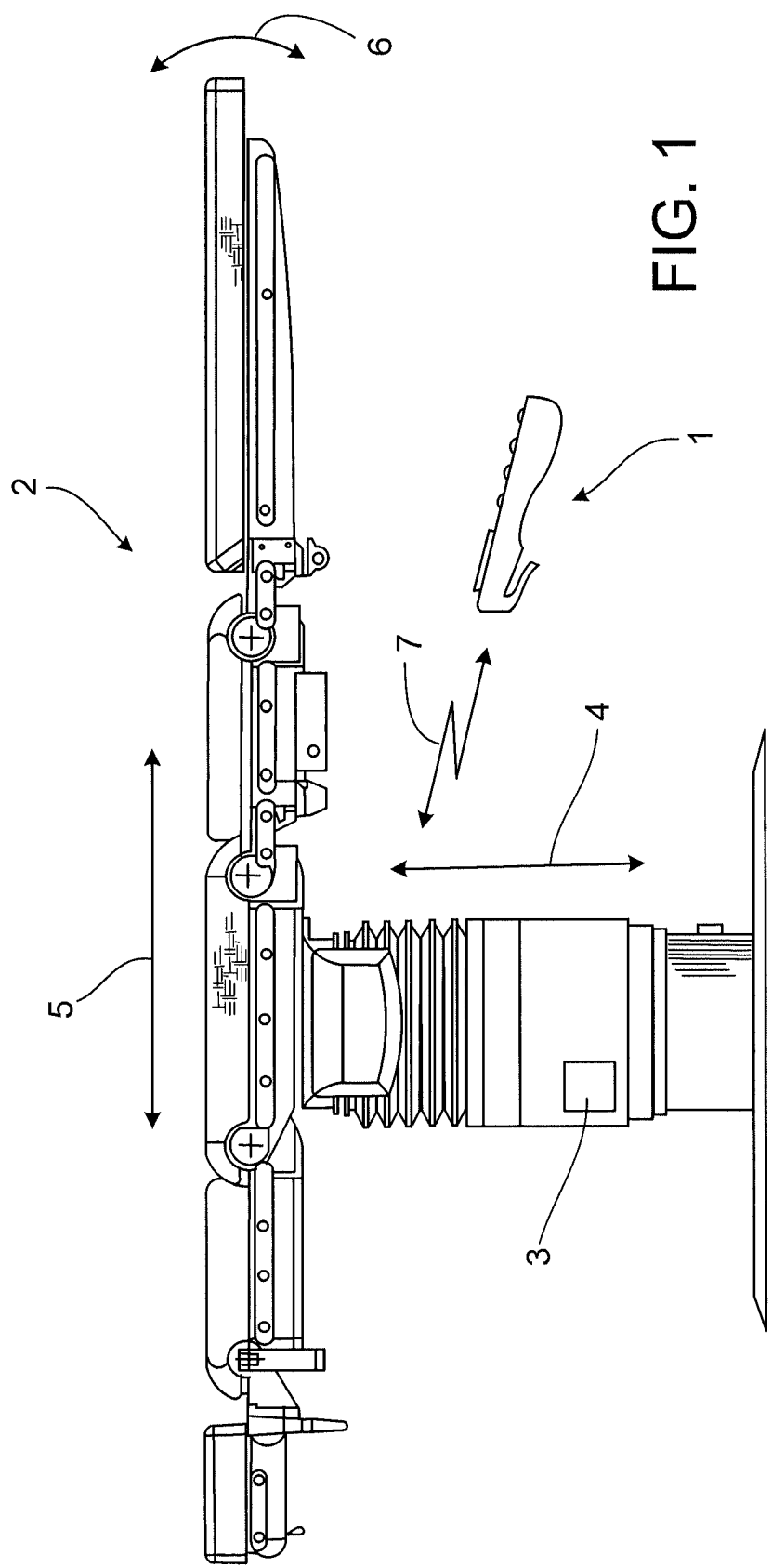
FIG. 1 is a schematic view of a medical apparatus (e.g., a surgical table) and a switching device (i.e., a remote control) of the medical apparatus.

FIG. 1 shows a switching device 1 for a medical apparatus 2. In the illustrated example, the switching device 1 is in the form of a remote control for operating the medical apparatus 2 that is in the form of a surgical table. The surgical table 1 includes a control device 3 which is configured to control various functions of the medical apparatus 2, such as a drive for height adjustment 4, a drive for longitudinal displacement 5 and a drive for pivoting 6. The switching device 1 is connected to the medical apparatus via a wireless data connection 7 by which commands for the operating functions (e.g., height adjustment 4, longitudinal displacement 5, or pivoting 6) are provided to the control device 3 of the medical apparatus 2.

While the switching device 1 is shown and described as a remote control, it can also be integrated into the medical apparatus 2, or it can be provided at another suitable location (e.g., along a wall or in a medical supply unit). The data connection 7 is in the form of a combined infrared and radio communication. Alternatively, only one of the two types of data connections can be used or the commands for operating functions can be transmitted in another manner. It is also not required that the commands for the operating functions are transmitted in a wireless manner. A wired connection between the switching device 1 and the control device 3 of the medical apparatus 2 is also possible (e.g., when the switching device 1 is integrated in the medical apparatus 2).

In addition to a surgical table, the switching device 1 can be used with other types of medical apparatuses, such as, for example, surgical lamps, anesthesia machines, medical supply units, and miscellaneous other apparatuses on which faultily switching can lead to a safety threat to a patient, an operator, or another person present.

Figure 2A:
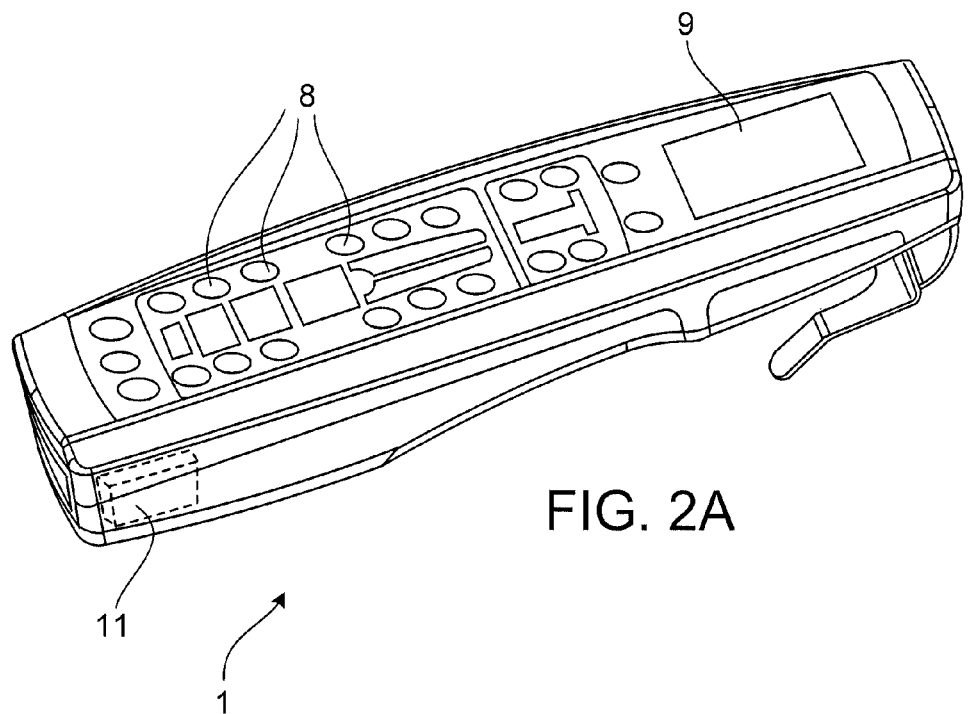
FIG. 2a is a perspective view of a switching device without symbols of operating functions of the medical apparatus.
Figure 2B:
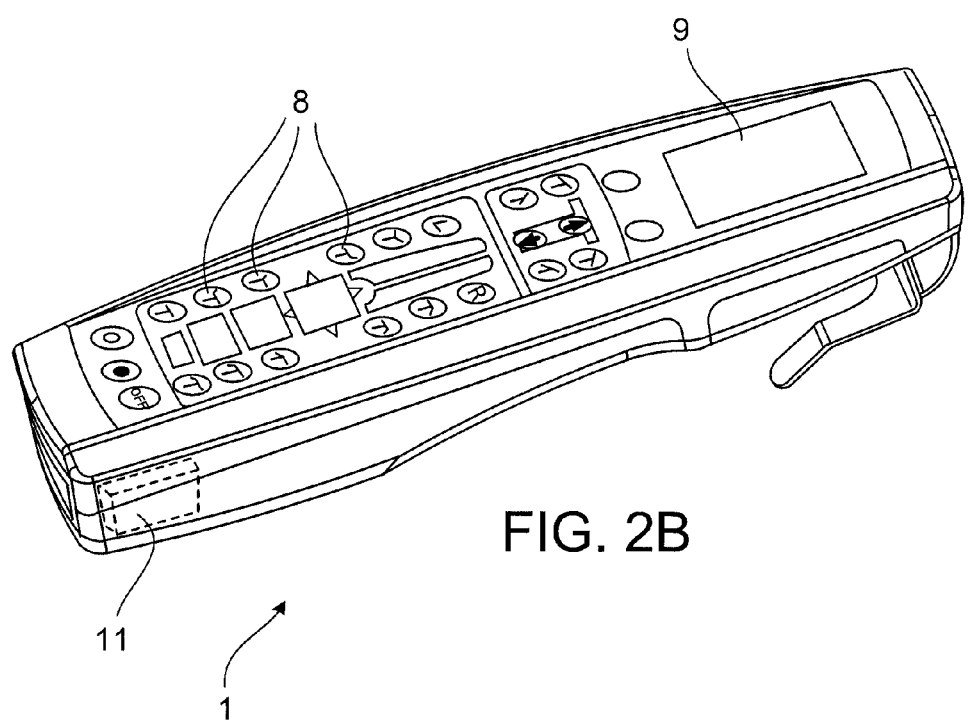
FIG. 2b is a perspective view of a switching device having symbols of operating functions of the medical apparatus.

Referring to FIGS. 2a and 2b, multiple keys 8, as described below, are provided on the upper side of the switching device 1. On the keys 8, as shown in FIG. 2b, a symbol for an assigned operating function (e.g., a surgical table configuration or position) is temporarily indicated. Typically, only the symbols of the operating functions that are possible due to the configuration of the medical apparatus 2 (i.e., the configuration of the surgical table with different positioning plate members) and that are possible, due to the actual position of the surgical table, are indicated to prevent the surgical table from inadvertently tilting or becoming unstable.

The switching device 1 includes a touch screen 9 by which basic adjustments of the medical apparatus 2 (e.g., to pre-selected positions) can be controlled. Furthermore, using the touch screen 9 it is also possible to operate other devices, such as, for example, turning on an endoscopy light at the surgical table, storing positions of the several positioning plate members, or to control other medical apparatuses (e.g., a surgical lamp).

The switching device 1 includes a position/acceleration sensor 11 when the switching device 1 is used as a remote control. Using the position/acceleration sensor 11, movement of the remote control can be detected, whereby the remote control can be activated from a standby state. In addition, the remote control 1 can be configured such that as long as the position/acceleration sensor 11 detects a movement, the remote control maintains active and does not enter the standby state.

Figure 3A:
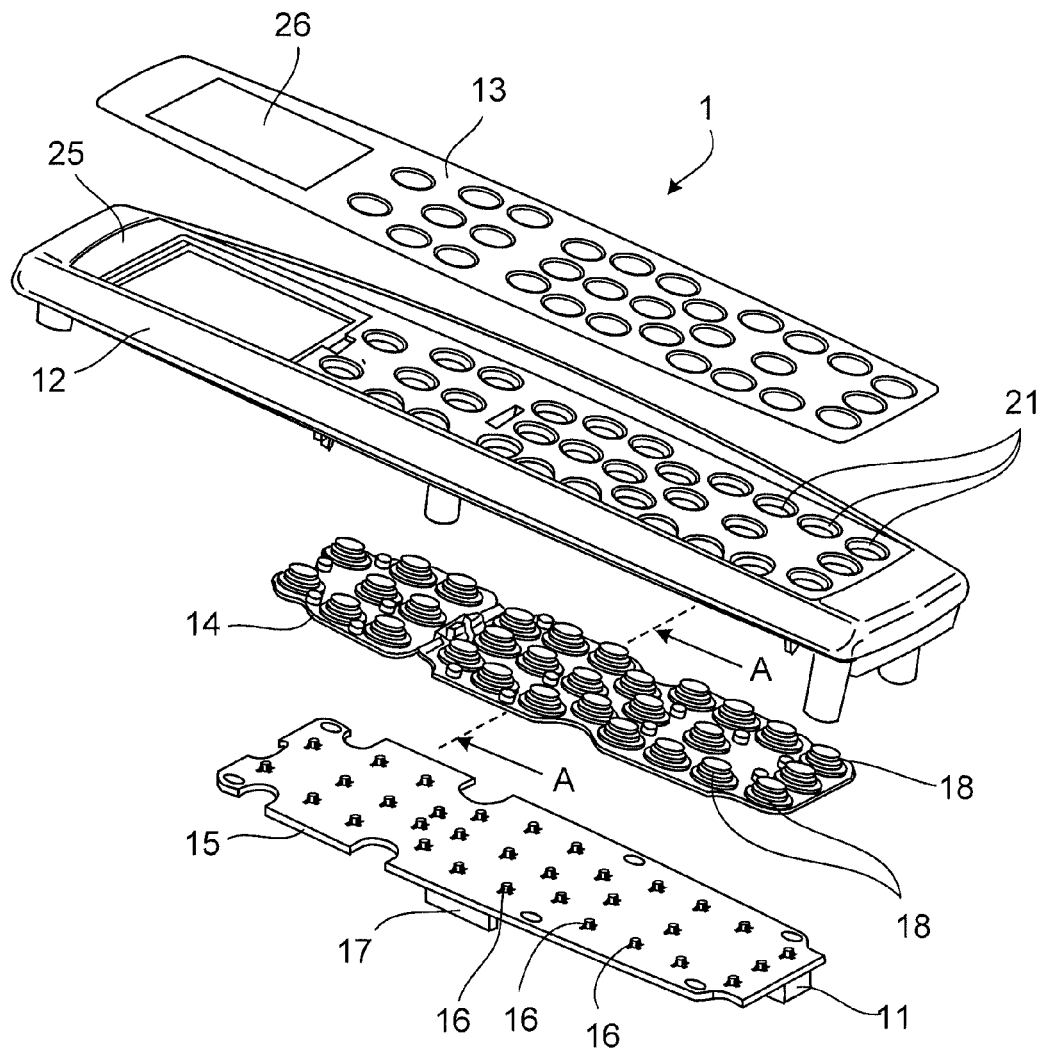
FIG. 3a is an exploded view of a switching device.

As shown in the exploded view of FIG. 3a, the switching device 1 includes an upper shell 12, a foil 13, a switching mat 14, and a circuit board 15.

The upper shell 12 is made of a chemical resistant plastic and forms an upper part of a housing of the remote control 1. The upper shell 12 includes a recess 25 in which the foil 13 is inserted and joined with the upper shell 12. At the locations at which keys 8 are provided on the remote control (shown in FIGS. 2a and 2b), through holes 21 (discussed below) are provided in the upper shell. The recess 25 formed in the left region (as shown in FIG. 3a) accommodates the touch screen 9. At the lower side of the upper shell 12, four standoff bosses are illustrated by which the upper shell 12 is connected to a lower shell. The lower shell is typically made from the same material as the upper shell 12.

The foil 13 serves to protect the inner components of the remote control 1 and also to provide decoration. The foil 13 is made of a chemical resistant material and has a smooth surface which is typically easy to clean. The foil 13 is designed such that it transmits light at the locations where keys 8 are provided such that the symbols assigned to the operating functions of the keys 8 are visible and that the foil 13 assumes the functions (discussed below) of the keys 8.

As shown, the foil 13 also includes a transparent window 26 that is provided for the touch screen 9.

The switching mat 14 is made of an elastomer which transmits light. The elastomer switching mat 14 includes pushbutton areas 18 in the form of elevations at the respective locations at which keys 8 are provided. As discussed below, contacts are provided along the lower side of the elastomer switching mat 14.

Figure 3B:
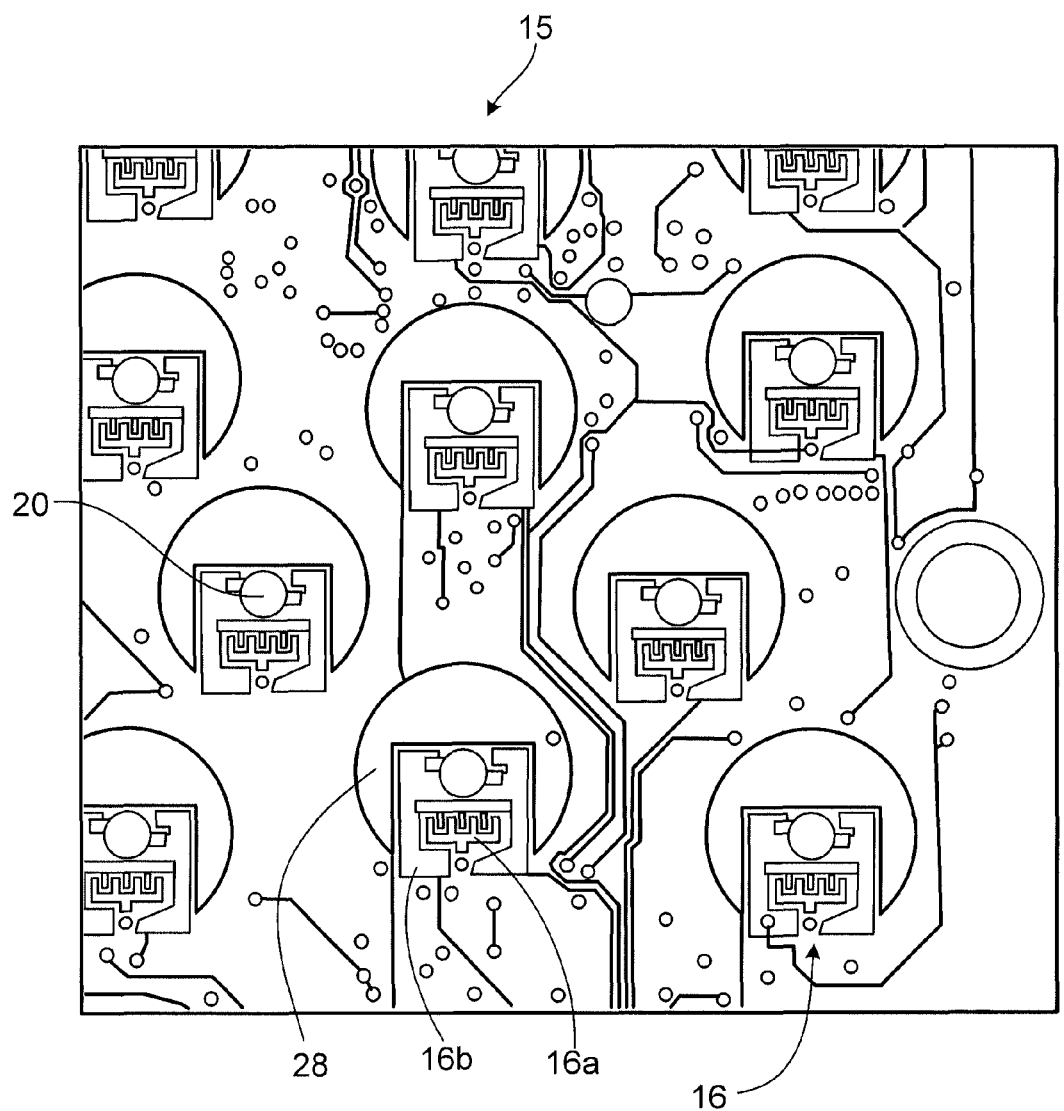

The circuit board 15 can be made of any of various suitable commercially available materials and includes contact areas 16 formed along its upper side at the locations at which the keys 8 are provided. Referring to FIG. 3b, the contact areas 16 include two cooperating contact regions 16a and 16b that are each formed in a toothed rack shape and arranged in a geared orientation with respect to one another with a small distance between them. In some embodiments, one or more of the contact areas 16 has a larger area (shown as 16b in FIG. 3b) in order to create a sensor area for one or more second switching members. Alternatively, several sets of contact areas can be provided per each key 8. The contact areas 16 are typically made from copper or, alternatively, from another suitable material. The position/acceleration sensor 11 and an evaluation device 17 for the switching device 1 are provided on the circuit board 15. The position/acceleration sensor 11 can also be provided at other locations in the remote control 1.

Figure 4A:
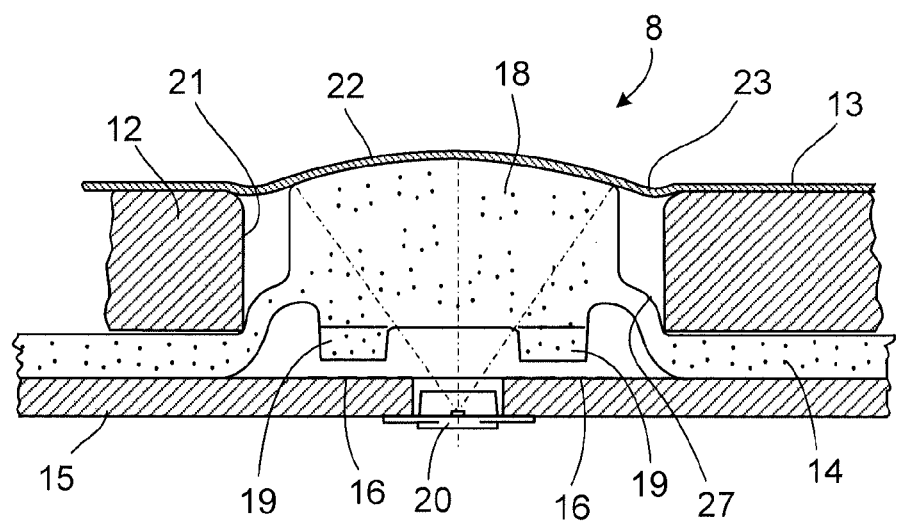

FIG. 4a shows a cross-sectional view of the key 8 through the cutting line A-A shown in FIG. 3a. The key 8 is formed by the foil 13, the pushbutton area 18 of the elastomer switching mat 14 with contacts 19, and the circuit board 15 with the contact areas 16.

The foil 13 is configured such that it has a generally dome-shaped elevation 22 at the location of the key 8. The dome-shaped elevation 22 is connected to the surrounding area of the foil 13 via a rim 23 curved oppositely to the dome-shaped elevation 22. The surrounding area of the foil 13 is connected to the upper shell 12. By this configuration of the dome-shaped elevation 22, the curved rim 23, and the selection of the material of the foil 13, the foil 13 is stressed radially about the dome-shaped elevation 22 when the dome-shaped elevation 22 is pushed toward the circuit board 15. Therefore, the dome-shaped elevation 22 snaps downwards when it is pushed beyond a certain point in order to have a clicker effect so that the operator obtains a tactile response of the operation of the key 8. When the dome-shaped elevation 22 of the key 8 is released, the dome-shaped elevation 22 typically returns to the position shown in FIG. 4a automatically.

By pushing the dome-shaped elevation 22 downward, the pushbutton area 18 of the elastomer switching mat 14 is also pushed downward. This is possible due to the configuration of a transition area 27 between the pushbutton area 18 and the surrounding area of the switching mat 14. When pushbutton area 18 is pushed downward, the transition area 27 is compressed by the surrounding area of the elastomer switching mat 14 which provides a force acting radially towards the center of the key 8 in the direction of an upper side of the switching mat 14. The transition area 27 is curved in the region of the connection to the pushbutton area 18. By this configuration of the transition area 27, the pushbutton area 18 may move downwards when the dome-shaped elevation 22 of the foil 13 is pushed. This configuration of the transition area 27 is preferably designed such that little to no disturbance of the tactile behavior happens by the switching mat 14. In some embodiments, however, by another design of the transition area 27, just the switching mat 14 may create a desired single tactile behavior of the pushbutton operation. For example, a two-stage tactile behavior of the key 8 could be created, firstly, by the foil 13 and, subsequently, by the switching mat 14.

Figure 4B:
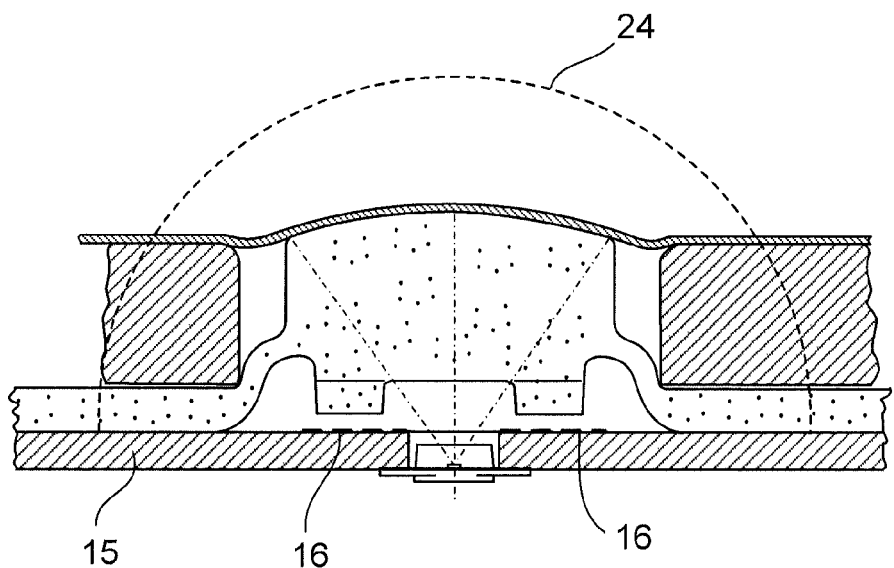

At the lower side of the pushbutton area 18, two contacts 19 are provided. The contacts 19 are illustrated in FIGS. 4a and 4b and extend perpendicularly to the drawing plane in order to connect the two contact areas 16. The contacts 19 are metal plated (e.g., gold plated). Alternatively, they can be made from or covered by another suitable material. The elastomer switching mat 14 is typically made from silicone but can also be made from another suitable material. The material of the elastomer switching mat 14 is typically transparent or semi-transparent so that it can serve as fiber optics.

The circuit board 15 is attached in the housing of the remote control 1 such that the switching mat 14 is arranged between the circuit board 15 and the upper shell 12. The circuit board 15 has the contact areas 16 formed along an upper side. The contact areas 16 are illustrated in the cross-sectional view in FIGS. 4a and 4b, however, they extend in a direction perpendicular to the drawing plane. When the key 8 is fully pressed downward, these contact areas 16 are connected to the contacts 19 in order to perform the switching operation of the key 8.

Furthermore, the contact areas 16 operate as sensors for a second switching member (discussed below).

Centrally under the keys 8, the circuit board 15 is respectively provided with a bore in which an illuminant 20 (e.g., an LED) is provided. The illuminant 20 is activated when the operating function (e.g., a configuration of the operating table) to performed by the respective key is available, as described above. The emitted light of the illuminant 20 irradiates through the elastomer switching mat 14 which transmits light through the pushbutton area 18 serving as fiber optics so that symbols provided as translucent areas in the foil 13 can be recognized.

The through hole 21 is typically aligned with the pushbutton area 18 such that the diameter of the through hole 21 basically corresponds to the outer diameter of the transition area 27 in order to provide a defined guide for the pushbutton area 18 without limiting the movability of the pushbutton area 18.

The switching mat 14 with the contacts 19, the circuit board 15 with the contact areas 16, and the foil 13 with the dome-shaped elevation 22 form a first switching member functioning based on the switching principle of an electromechanical switch (e.g., a contact switch).

In the switching device 1, a second switching member functioning based on the switching principle of a proximity switch is also provided. In FIGS. 3b and 4b, the contact areas 16 are shown, where the contact area with the larger area 16b (shown in FIG. 3b) and a another conductive area 28 on the circuit board 15 in close vicinity to the contact areas 16 serve as electrodes for a capacitive sensor. By using one of the contact areas (e.g., contact area 16b) as sensor areas, a detection space 24 extending above the contact areas 16 is formed. In the detection space 24, an electrical field is created and is detected when a dielectric object (e.g., a finger) is inserted into the detection space 24. The contact area 16 together with the further conductive area and the evaluation device 17 constitute the second switching member.

Alternatively to a capacitive sensor, the proximity switch can be based on other switching principles. For example thermo sensors for detecting heat radiation, microphones for detecting noises (e.g., voice input), or optical sensors can be used. The advantage of a capacitive sensor is that electromagnetic fields and static electricity charge can be recognized and suppressed using specific patterns.

In FIG. 4b, the illustration of the detection space 24 is only principally illustrated as one detection space 24. The entire detection space is formed by a combination of individual detection spaces 24 formed by the contact areas 16 of, for example, five adjacent keys 8. The number of the combined individual detection spaces 24 forming the entire detection space can vary between one individual detection space 24 per key 8 to one combined detection space for all of the keys 8. However, for further functions, it is favorable if at least two individual detection spaces which are not combined or at least two entire detection spaces as a combination of individual detection spaces 24 are present.

The second switching member is adapted such that the presence of an operating object (e.g., a finger) in the detection space 24 is detected with little complexity. Furthermore, the second switching member is also typically able to recognize a distance between the operating member and the contacts 16. The evaluation device 17 is adapted such that it can recognize, by the detection of a distance between the operating object and the contact areas 16 using the second switching member, if the operating object is merely located in the detection space, if the operating object touches one of the keys 8 arranged in the detection space 24, or if one of the keys 8 arranged in the detection space 24 is operated.

During use, the switching device 1, if it is configured as a wireless remote control, enters a standby state in order to prevent unnecessarily discharging the energy storage in the remote control 1 when it is not actively being used. If the switching device 1 is connected to the medical apparatus 2 by a cable, it may always be active.

The switching device 1 in the form of a wireless remote control is activated by inserting an operating object (e.g., a hand or finger) into at least two detection spaces 24 of the second switching members. In some embodiments, as described above, it is also possible to activate the remote control by a movement detected by the position/acceleration sensor 11. Inserting an operating object in only one detection space 24 typically does not activate the remote control 1 because there can be a high risk of an undesired activation (e.g., caused by a medical instrument falling on the remote control).

The selection of an operating function of the medical apparatus 2 is controlled such that the second switching member assigned to the respective key 8 for the desired operating function first recognizes the operating object approaching and it then releases (e.g., activates) the keys so that they can be selected using the first switching members assigned to the second switching member. Next, one of the keys of the first switching member in the detection space 24 is operated and the switching device 1 provides a command to the control device 3 to perform the respective operating function.

If two keys 8 in one detection space 24 are operated, the control device 1 outputs an error message and none of the functions are performed.

Because the second switching member does not only recognize if the operating object is located in the detection space 24 but, also, if the operating object is in a position in which it touches or operates one of the keys 8 in the detection space 24, the evaluation device 17 can recognize errors. For example, if the first switching member is faulty in such way that a first switching member does not select an operating function even if the corresponding key 8 is operated or, instead, if a first switching member selects an operating function although it is not operated by the key 8. In both cases, no switching command for selecting the operating function is output by the evaluation device 17 and an error message is output immediately when recognizing a fault.

As an additional safety function, the switching device 1 can be configured as a remote control that does not output switching signals when it recognizes by the position/acceleration sensor of the remote control that the remote control is orientated such that the keys 8 point downwards because, here, a mistaken operation can be assumed.

Furthermore, the second switching member includes a cyclic (e.g., automatic) recalibration feature. During this cyclic recalibration, the sensitivity of the sensors is re-adjusted. A goal of the recalibration is also to maintain consistent sensor sensitivity under different operating conditions. For example, the switching device 1 can be used reliably, due to the cyclic recalibration, even if an apparatus emitting a high electrical radiation (e.g., an operated electro surgery apparatus) is located in the environment. Using the systems and methods described herein, the switching device 1 can be used reliably while also preventing unintended switching operations.

A number of embodiments of the invention have been described. Nevertheless, it will be understood that various modifications may be made without departing from the spirit and scope of the invention. Accordingly, other embodiments are within the scope of the following claims.

What is claimed is:

1. A switching device for a medical apparatus, the switching device comprising:
a plurality of first switching members each adapted to perform a function, the first switching members based on a first switching principle to cause performance of the functions;
a plurality of second switching members based on a second switching principle different from the first switching principle and operable to generate a detection space;
wherein the detection space extends external to the switching device into a volume adjacent to the first switching member and detects a presence of an operating object adjacent the first switching member and external to the switching device, wherein operation of the first function is precluded if the operating object is not in the detection space and detected by the second switching member,
wherein at least one second switching member is assigned to each of the plurality of first switching members, and wherein each of the plurality of first switching members is arranged in a respective detection space of the at least one second switching member; and
an evaluation device for selecting the assigned operating function of the plurality of first switching members when a switching member of the plurality of first switching members and the at least one second switching member assigned to the switching member are operated by the operating object.

2. The switching device according to claim 1, wherein the first switching member is an electro-mechanical switch.

3. The switching device according to claim 1, wherein the second switching member is a proximity switch.

4. The switching device according to claim 3, wherein the second switching member is a capacitive sensor.

5. The switching device according to claim 1, wherein a first component of the first switching member and a second component of the second switching member are the same component.

6. The switching device according to claim 5, wherein the first and second components comprise sensor contact surface areas of the first and second switching members, respectively.

7. The switching device according to claim 1, wherein the evaluation device is configured to recognize when the operating object is in a position in which the operating object operates the first switching member by a signal of the second switching member.

8. The switching device according to claim 7, wherein the evaluation device is further configured to output an error signal when the evaluation device recognizes that the first switching member is operated but does not provide switching signals to the evaluation device by the signal of the second switching member.

9. The switching device according to claim 1, wherein the switching device is a remote control for a medical apparatus.

10. The switching device according to claim 9, wherein the remote control comprises a position sensor and an evaluation device for recognizing the spatial orientation of the remote control.

11. The switching device according to claim 9, wherein the remote control is configured such that the remote control is activated when the evaluation device recognizes switching signals for a simultaneous operation of several second switching members of the multiple second switching members.

12. The switching device according to claim 9, wherein the medical apparatus is a surgical table.

13. A medical apparatus comprising:
a switching device for the medical apparatus, the switching device comprising:
a first switching member adapted to perform a first function of selecting an assigned operating function of the medical apparatus;
a second switching member adapted to perform a second function of permitting the first switching member to perform the first function; and operable to generate a detection space,
wherein the detection space comprises an open volume including an outer region disposed external to the switching device adjacent the first switching member, and in which the second switching member detects a presence of an operating object,
wherein the first switching member is arranged in the detection space such that an external user contact surface of the first switching member is disposed with the open volume of the detection space, and
an evaluation device for selecting the assigned operating function of the first switching member when the first switching member and the second switching member assigned to the first switching member are operated by the operating object,
wherein operation of the first function is precluded if an operating object is not positioned in the detection space and detected by the second switching member.

14. A method for operating a switching device for a medical apparatus, the method comprising:
creating a detection space comprising an open volume with a second switching member, the open volume extending into an outer region external to the switching device;
detecting, using the second switching member, the presence of an approaching operating object in the outer region of the open volume, the outer region of the open volume disposed external to the second switching member and external to and adjacent a first switching member assigned to the second switching member;
based on the second switching member failing to detect the presence of the operating object in the outer region of the open volume, precluding the release of the first switching member, and
operating the first switching member, via contact of the operating object with an external user contact surface of the first switching member that is disposed with the open volume of the detection space, such that an operating function selected by the first switching member is carried out when the operating object is detected in the open volume by the second switching member.

15. The method according to claim 14, wherein a position of the operating object in which the operating object operates the first switching member is recognized by the second switching member.

16. The method according to claim 15, further comprising: outputting an error signal when the position of the operating object in which the operating object operates the first switching member is recognized, but the first switching member is not operated, or outputting an error signal when the first switching member is operated, but no operating object is recognized in the position in which the operating object operates the first switching member.

17. The method according to claim 14, wherein the switching device is activated when a plurality of second switching members recognize the operating object in the position in which the operating object operates the first switching member.

18. The method according to claim 14, wherein the switching device is a remote control, and an evaluation device does not output switching signals when the evaluation device recognizes, using position sensors, that the remote control is oriented such that a key used to operate the first switching member points downwards.

19. The switching device according to claim 1, wherein at least a first portion of the first switching member and at least a second portion of the second switching member are disposed adjacent a same side of a circuit board, such that the first switching member is arranged in the detection space created by the second switching member.

20. The switching device according to claim 19, wherein the detection space extends from the second switching member towards, through, and past the external user contact surface of the first switching member such that the external user contact surface of the first switching member is disposed within the open volume of the detection space.

21. The medical apparatus according to claim 13, wherein at least a first portion of the first switching member and at least a second portion of the second switching member are disposed adjacent a same side of a circuit board, such that the first switching member is arranged in the detection space created by the second switching member.

22. The medical apparatus according to claim 21, wherein the detection space extends from the second switching member towards, through, and past the external user contact surface of the first switching member such that the external user contact surface of the first switching member is disposed within the open volume of the detection space.

23. The method according to claim 14, wherein at least a first portion of the first switching member and at least a second portion of the second switching member are disposed adjacent a same side of a circuit board, such that the first switching member is arranged in the detection space created by the second switching member.

24. The method according to claim 23, wherein the detection space extends from the second switching member towards, through, and past at least the external user contact surface of the first switching member such that the external user contact surface of the first switching member is disposed within the open volume of the detection space.

* * * * *